(12) United States Patent
Liang

(10) Patent No.: US 8,920,903 B2
(45) Date of Patent: *Dec. 30, 2014

(54) PLATE STRUCTURE WITH EASY ASSEMBLY

(75) Inventor: Chen-Yi Liang, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 316 days.

This patent is subject to a terminal disclaimer.

(21) Appl. No.: 13/558,327

(22) Filed: Jul. 25, 2012

(65) Prior Publication Data

US 2013/0078416 A1 Mar. 28, 2013

(30) Foreign Application Priority Data

Sep. 23, 2011 (TW) .............................. 100134408 A

(51) Int. Cl.
*B32B 3/06* (2006.01)
*H05K 5/02* (2006.01)

(52) U.S. Cl.
CPC .................................... *H05K 5/0243* (2013.01)
USPC ..................... 428/100; 312/223.1; 312/223.2; 428/98

(58) Field of Classification Search
USPC .................. 428/100, 99; 312/223.1, 223.2
See application file for complete search history.

(56) References Cited

U.S. PATENT DOCUMENTS 7,824,793 B2 11/2010 Zuo
8,350,149 B2 1/2013 Chen

FOREIGN PATENT DOCUMENTS

TW 201044944 12/2010

OTHER PUBLICATIONS

Office action mailed on Mar. 10, 2014 for the Taiwan application No. 100134408, filing date: Sep. 23, 2011, p. 2, p. 3 line 1~5, line 8~13, line 15~20 and line 22~26 and p. 4 line 1~2 and line 4~10.

*Primary Examiner* — Brent O'Hern
(74) *Attorney, Agent, or Firm* — Winston Hsu; Scott Margo

(57) ABSTRACT

An ornamental plate structure includes a supporting base and a sliding button. The sliding button includes a pressing portion, a first sliding portion, a fastening portion, and a contacting portion. The ornamental plate structure further includes a stopping component for stopping the contacting portion as the pressing portion moves in a first direction to drive the contacting portion simultaneously, a constraining component for constraining bending deformation of the contacting portion as the pressing portion is pressed in a second direction to drive the contacting portion simultaneously, and an ornamental plate. The ornamental plate includes a plate, a hooking component and a fixing component. The fixing component includes a wedging portion and a second sliding portion. The wedging portion wedges inside the fastening portion as the second sliding portion slides relative to the first sliding portion so as to fix the ornamental plate on the supporting base.

20 Claims, 16 Drawing Sheets

PLATE STRUCTURE WITH EASY ASSEMBLY

BACKGROUND OF THE DISCLOSURE

1. Field of the Disclosure

The disclosure provides an ornamental plate structure, and more particularly, to an ornamental plate structure with easy assembly.

2. Description of the Prior Art

Requirements of quality as well as aesthetic feeling of modern electronic products are increasing. For example, notebook computers with various ornamental plates become a trend in the market. Consumers are likely to buy the products due to preference for the ornamental plate with special patterns. Furthermore, an electronic product with a replaceable ornamental plate is even more popular in the market. However, mechanisms adapted to the replaceable ornamental plate of the notebook computer generally adopt combination of a button and a spring, so as to require more mechanical components and larger mechanical space. In addition, assembly of the above-mentioned mechanism is inconvenient, either. Thus, how to design an ornamental plate structure with easy assembly and less cost becomes an issue of the mechanical design of the electronic device.

SUMMARY OF THE DISCLOSURE

The disclosure provides an ornamental plate structure with easy assembly for solving above drawbacks.

According to the claimed disclosure, an ornamental plate structure with easy assembly includes a supporting base whereon a slot and a hole are formed. The ornamental plate structure further includes a sliding button installed on a side of the supporting base. The sliding button includes a pressing portion, a first sliding portion, a fastening portion and a contacting portion. The pressing portion is disposed through the hole on the supporting base in a movable manner. The first sliding portion is located in a position corresponding to the slot on the supporting base. The fastening portion is connected to the first sliding portion and located in a position corresponding to the slot on the supporting base. The contacting portion is connected to the pressing portion. The ornamental plate structure further includes a stopping component and an ornamental plate. The stopping component is installed on the supporting base for stopping the contacting portion as the pressing portion moves in a first direction to drive the contacting portion. The ornamental plate is installed on the supporting base in a detachable manner and includes a plate, a hooking component and a fixing component. The hooking component is disposed on a side of the plate for hooking the supporting base. The fixing component is installed on the plate and includes a wedging portion and a second sliding portion. The wedging portion wedges inside the fastening portion as the second sliding portion slides relative to the first sliding portion of the sliding button, so as to fix the ornamental plate on the supporting base.

According to the claimed disclosure, the ornamental plate structure further includes a constraining component installed on the supporting base for constraining bending deformation of the contacting portion as the pressing portion is pressed in a second direction to drive the contacting portion.

According to the claimed disclosure, when the fixing component of the ornamental plate presses the first sliding portion in a third direction, the second sliding portion slides relative to the first sliding portion, such that the sliding button slides in a direction opposite to the first direction and the wedging portion wedges the fastening portion.

According to the claimed disclosure, the fastening portion separates from the wedging portion as the pressing portion is pressed in the second direction and moved in the first direction.

According to the claimed disclosure, the ornamental plate structure further includes a restraining component installed on the supporting base and disposed through an end of the sliding button for restraining the sliding button from sliding in the first direction.

According to the claimed disclosure, an inclined plane is formed on a side of the contacting portion for guiding the contacting portion to slide relative to the stopping component.

According to the claimed disclosure, the contacting portion is a wedge-shaped structure or a hook.

According to the claimed disclosure, the ornamental plate structure further includes a stopping plate and a hook component installed on the supporting base for stopping the sliding button.

According to the claimed disclosure, the restraining component is an L-shaped rib.

According to the claimed disclosure, the pressing portion of the sliding button is a U-shaped structure.

According to the claimed disclosure, the contacting portion is a wedge-shaped structure or a hook.

According to the claimed disclosure, the ornamental plate structure further includes a stopping plate and a hook component installed on the supporting base for stopping the sliding button.

According to the claimed disclosure, an incline is formed on at least one side of the hole on the supporting base for guiding the pressing portion to be pressed in the second direction.

In summary, the ornamental plate structure of the disclosure utilizes the sliding button for replacing the ornamental plate and is adapted to a situation that the ornamental plate is surrounded by the supporting base. Furthermore, the ornamental plate structure has advantages of simple structure and fewer components, and there is no need to preserve large mechanical space for the ornamental plate structure. Accordingly, the disclosure provides the ornamental plate structure with easy assembly and less cost.

These and other objectives of the disclosure will no doubt become obvious to those of ordinary skill in the art after reading the following detailed description of the embodiment that is illustrated in the various figures and drawings.

DETAILED DESCRIPTION

Figure 1:
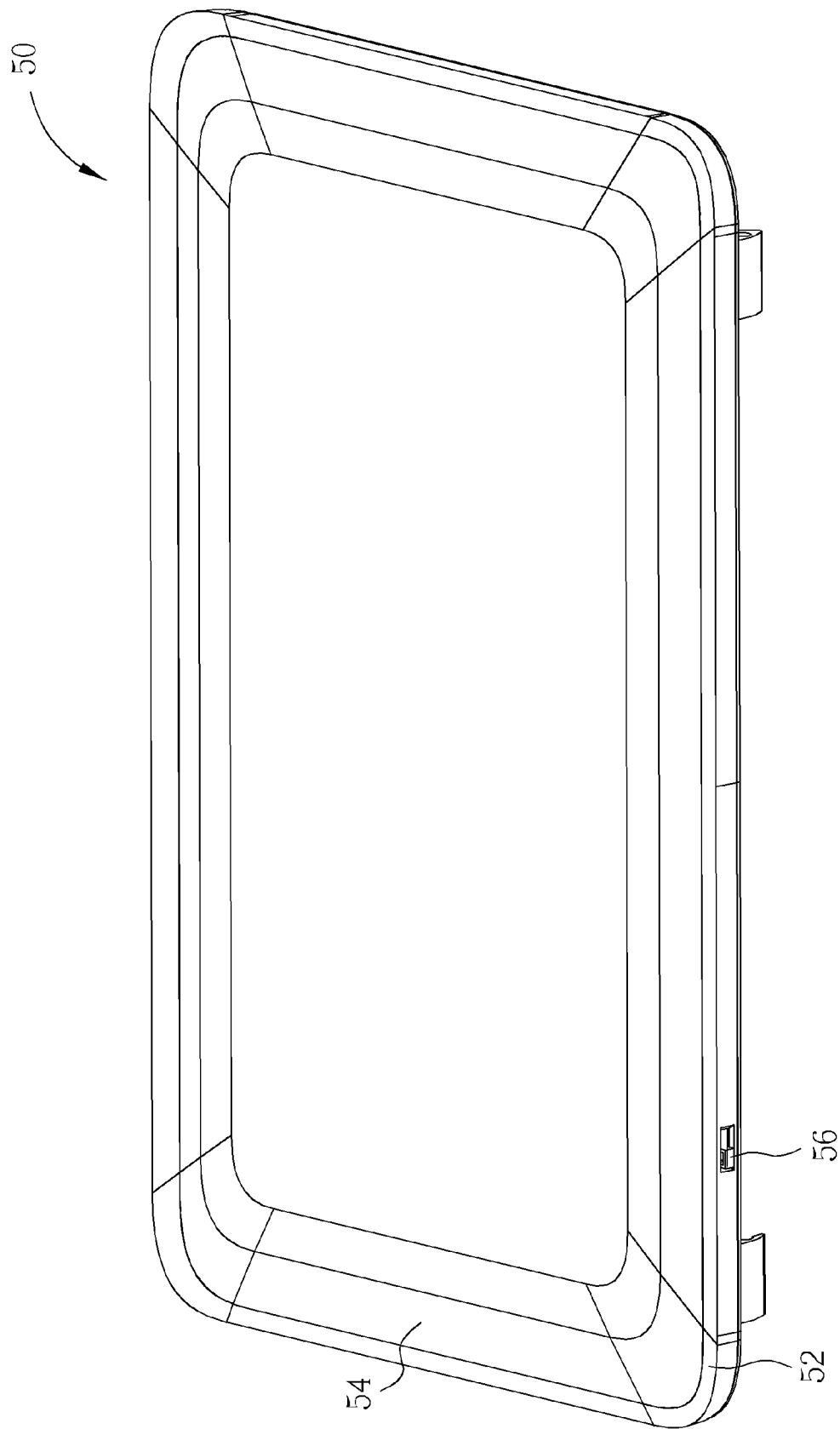
FIG. 1 is a schematic diagram of an ornamental plate structure with easy assembly according to an embodiment of the disclosure.

Please refer to FIG. 1. FIG. 1 is a schematic diagram of an ornamental plate structure 50 with easy assembly according to an embodiment of the disclosure. In this embodiment, the ornamental plate structure 50 can be a replaceable ornamental plate structure of a notebook computer. The ornamental plate structure 50 includes a supporting base 52, an ornamental plate 54 and a sliding button 56. The ornamental plate 54 is installed on the supporting base 52 in a detachable manner. The sliding button 56 is installed on a side of the supporting base 52. For example, the sliding button 56 can be installed on the side of the supporting base 52 in a slidable manner. But the way to install the sliding button 56 on the supporting base 52 can not be limited to that mentioned above, it can be other ways of installation. A user can detach the ornamental plate 54 from the supporting base 52 by sliding the sliding button 56, so as to replace the ornamental plate 54.

Figure 2:
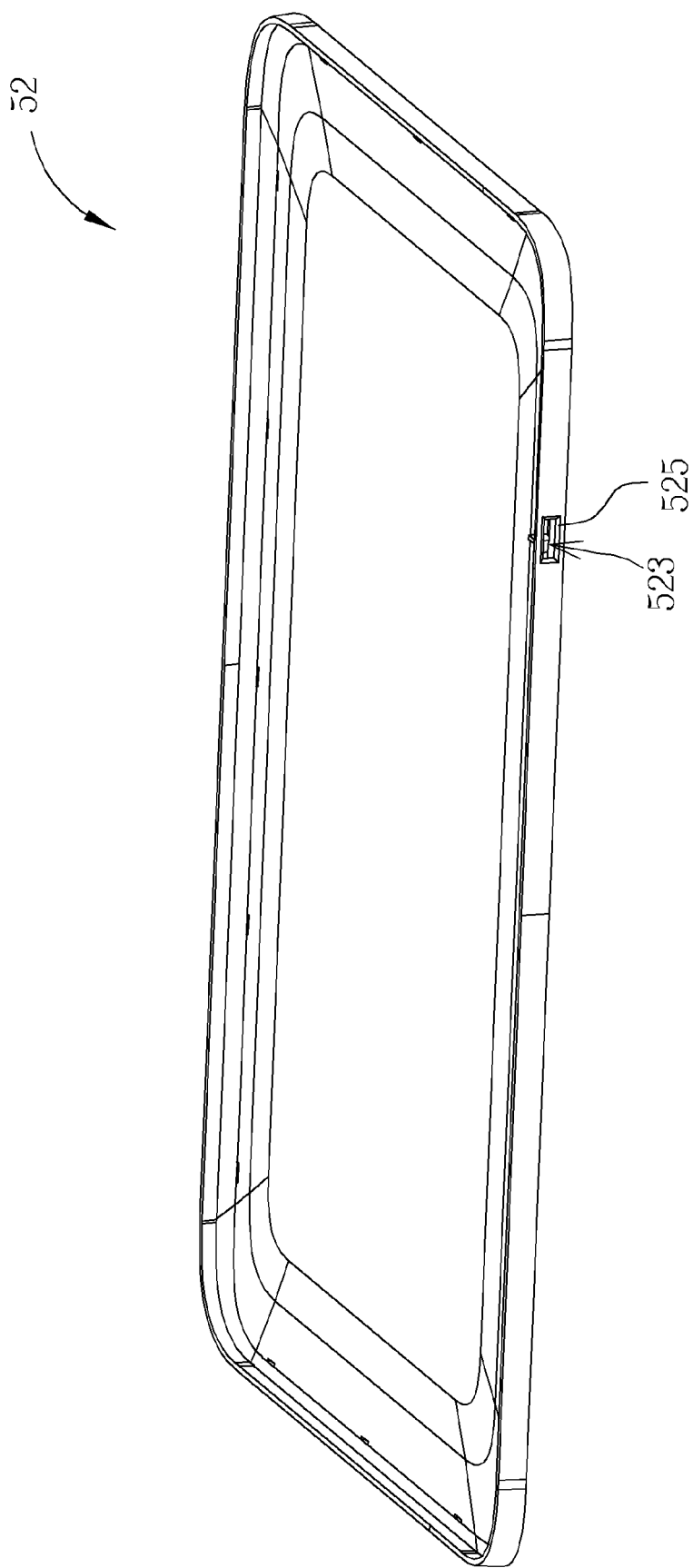
FIG. 2 and FIG. 3 are respectively schematic diagrams of a supporting base in different views according to the embodiment of the disclosure.
Figure 3:
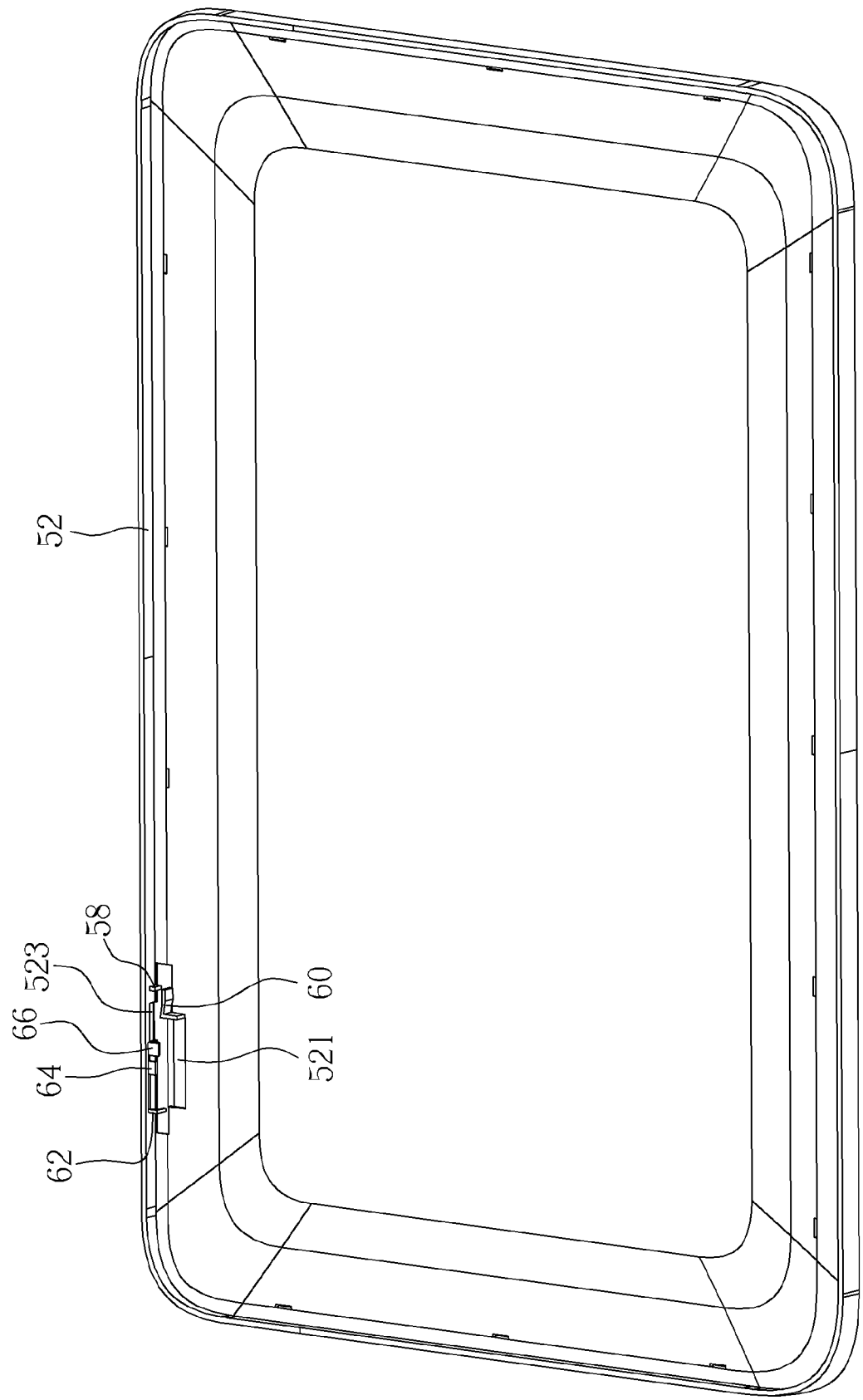
Figure 4:
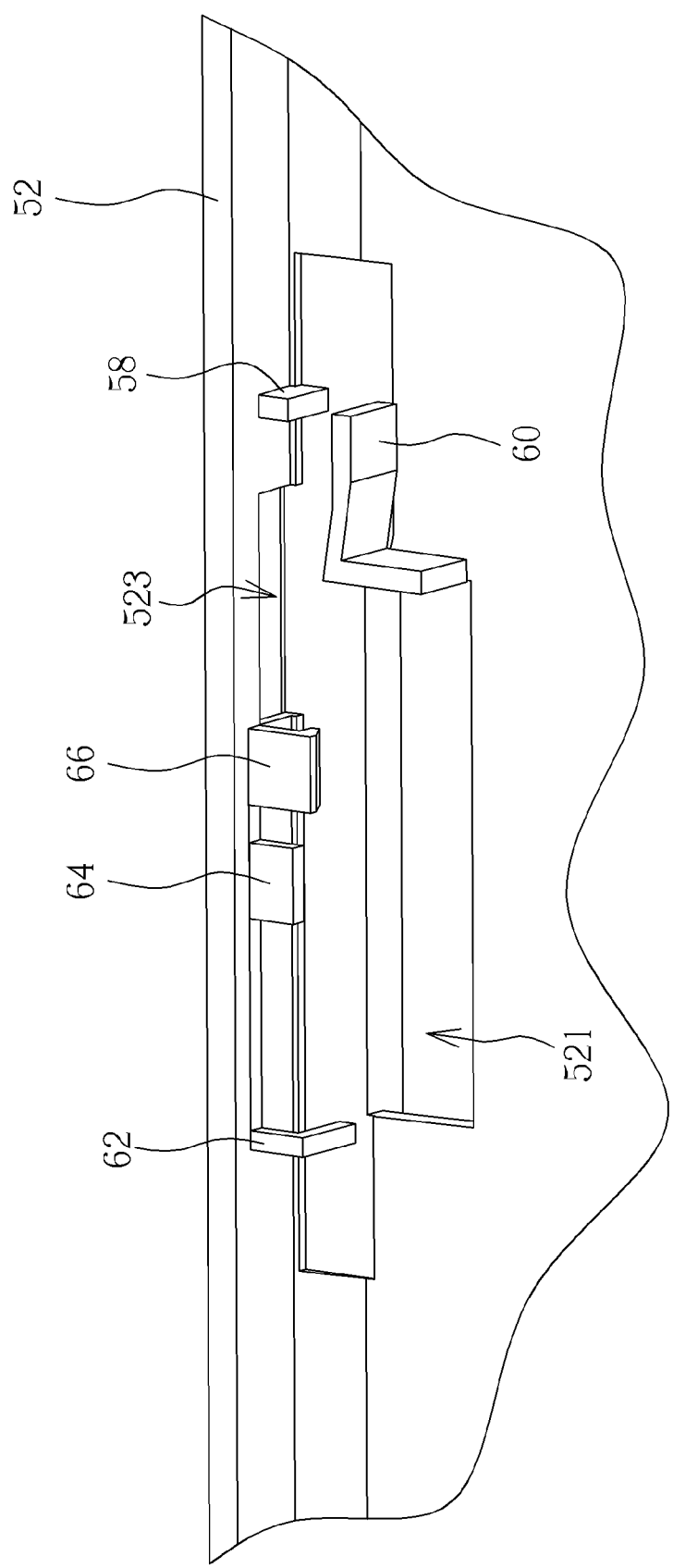
FIG. 4 is a partly enlarged diagram of the supporting base according to the embodiment of the disclosure.

Please refer to FIG. 2 to FIG. 4. FIG. 2 and FIG. 3 are respectively schematic diagrams of the supporting base 52 in different views according to the embodiment of the disclosure. FIG. 4 is a partly enlarged diagram of the supporting base 52 according to the embodiment of the disclosure. A slot 521 and a hole 523 are formed on the supporting base 52. As shown in FIG. 2, an incline 525 is formed on at least one side of the hole 523 on the supporting base 52. The ornamental plate structure 50 further includes a stopping component 58, a constraining component 60, a restraining component 62, a stopping plate 64 and a hook component 66. The stopping component 58, the constraining component 60, the restraining component 62, the stopping plate 64 and the hook component 66 are respectively installed on the supporting base 52. In this embodiment, the stopping component 58 can be a protruding rib, the constraining component 60 and the restraining component 62 can be respectively an L-shaped rib, and the supporting base 52, the stopping component 58, the constraining component 60, the restraining component 62, the stopping plate 64 and the hook component 66 can be integrally formed.

Figure 5:
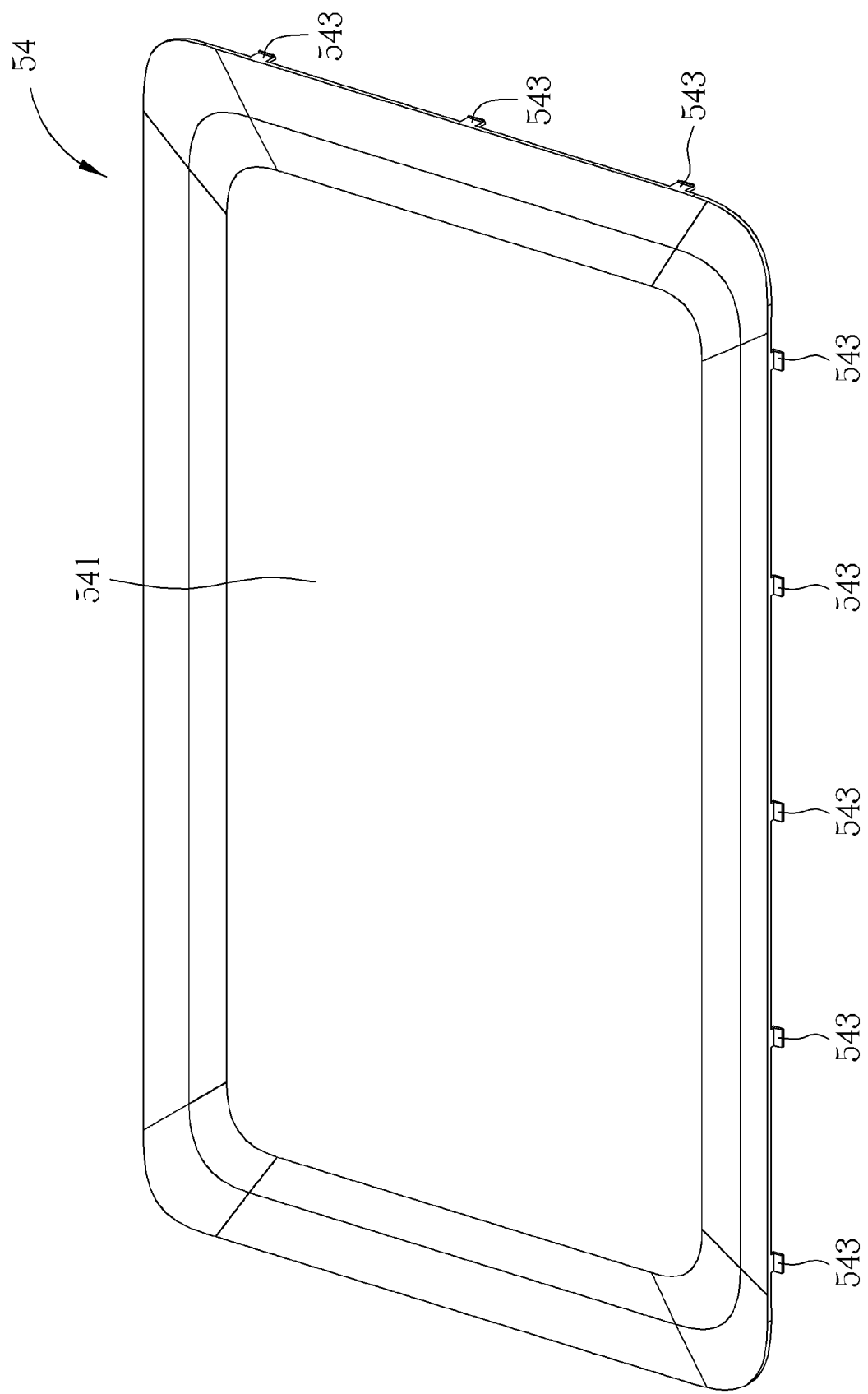
FIG. 5 and FIG. 6 are respectively schematic diagrams of an ornamental plate in different views according to the embodiment of the disclosure.
Figure 6:
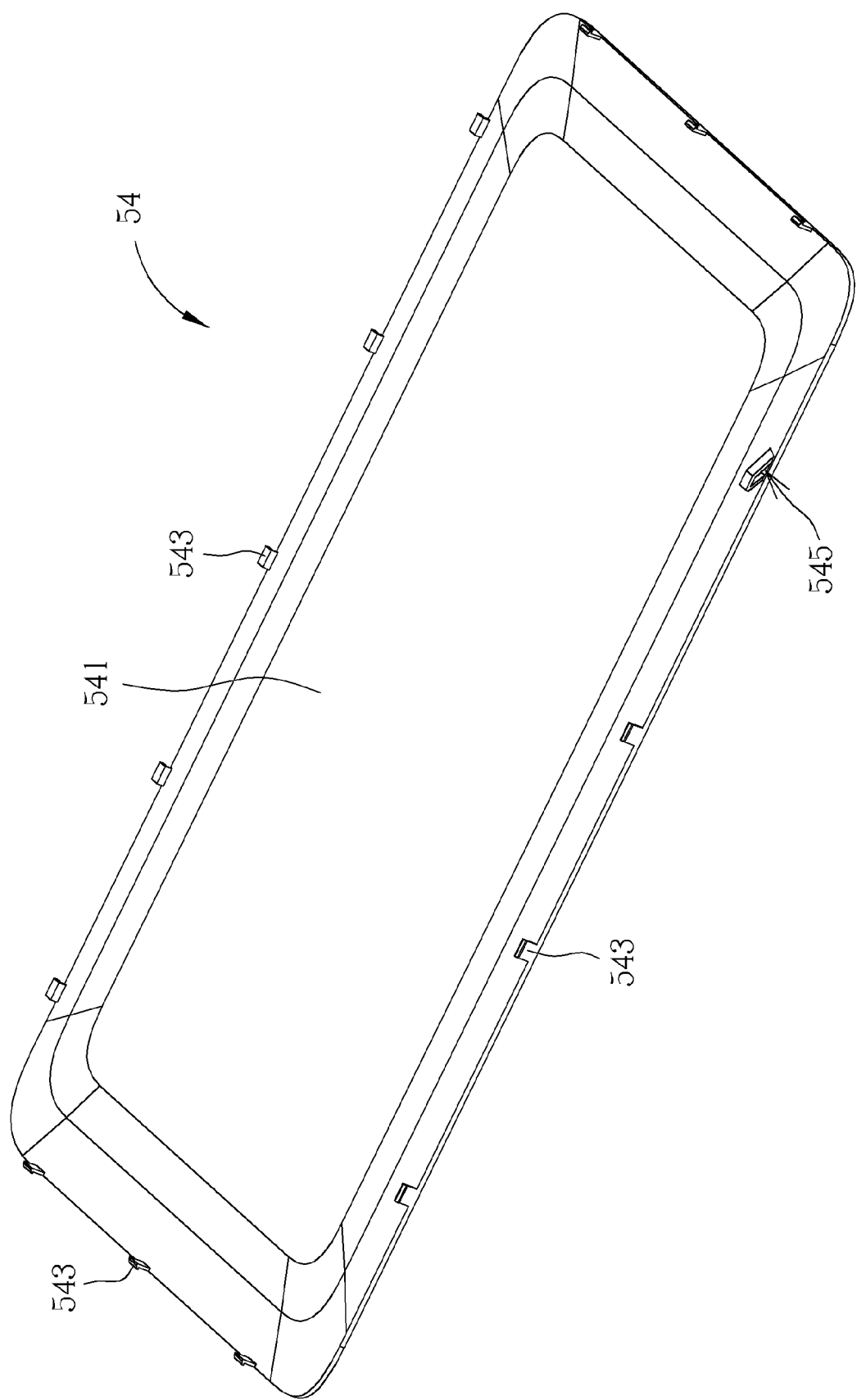
Figure 7:
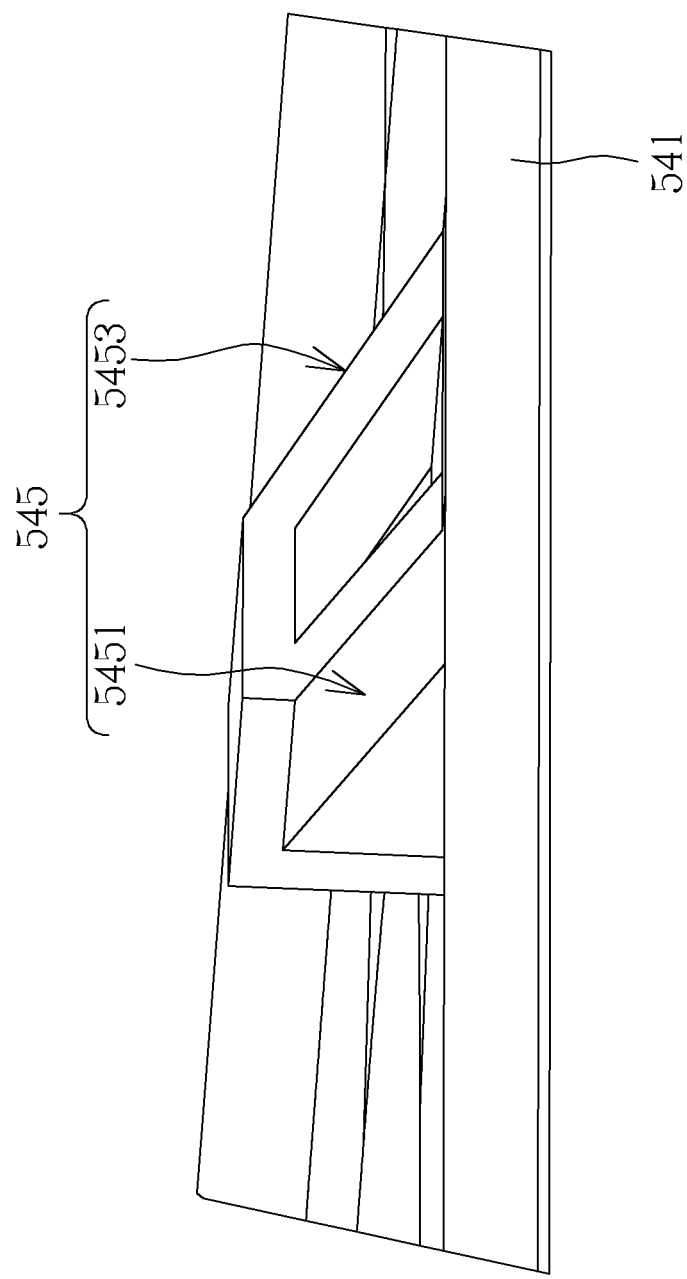
FIG. 7 is a partly enlarged diagram of the ornamental plate according to the embodiment of the disclosure.

Please refer to FIG. 5 to FIG. 7. FIG. 5 and FIG. 6 are respectively schematic diagrams of the ornamental plate 54 in different views according to the embodiment of the disclosure. FIG. 7 is a partly enlarged diagram of the ornamental plate 54 according to the embodiment of the disclosure. The ornamental plate 54 includes a plate 541, at least one hooking component 543 and a fixing component 545. The hooking component 543 is disposed on each side of the plate 541, such as on four sides of the plate 541, and is used for hooking the supporting base 52. For example, the hooking component 543 can be a hook. The hook with larger structural strength can only be detached by rotation, while the hook with smaller structural strength can be detached by enforcement. The fixing component 545 is installed on the plate 541 and includes a wedging portion 5451 and a second sliding portion 5453.

Figure 8:
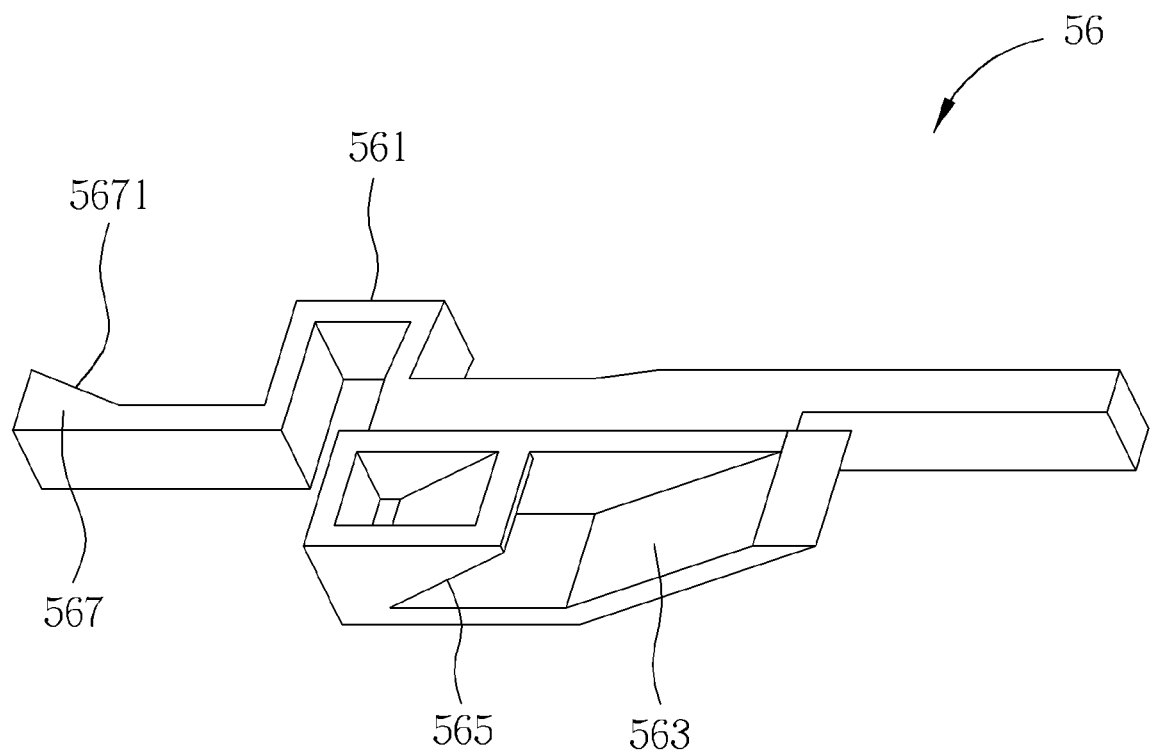
FIG. 8 is a diagram of a sliding button according to the embodiment of the disclosure.
Figure 9:
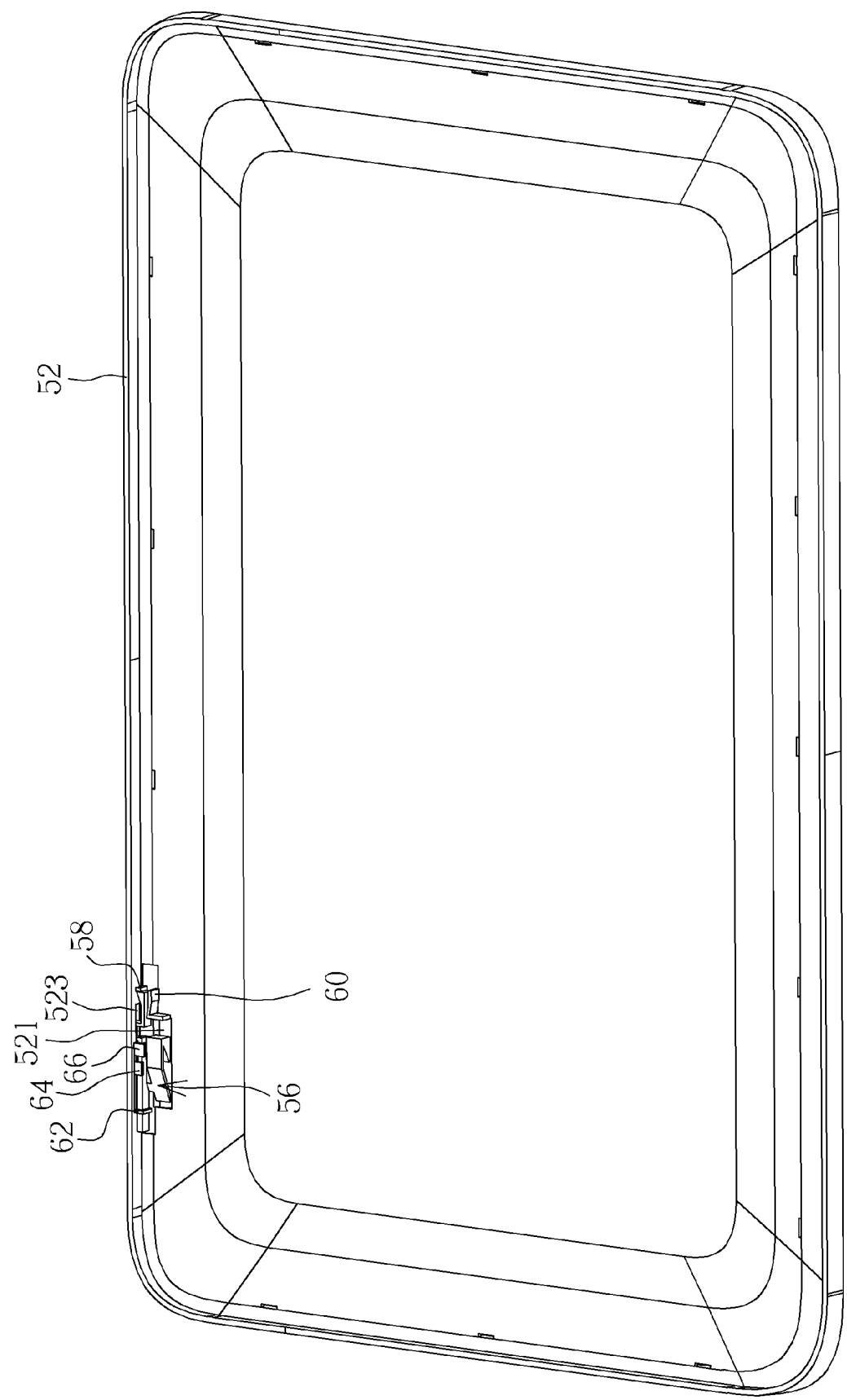
FIG. 9 is a diagram illustrating that the sliding button is installed on the supporting base according to the embodiment of the disclosure.

Please refer to FIG. 8 and FIG. 9. FIG. 8 is a diagram of the sliding button 56 according to the embodiment of the disclosure. FIG. 9 is a diagram illustrating that the sliding button 56 is installed on the supporting base 52 according to the embodiment of the disclosure. The sliding button 56 is installed on the side of the supporting base 52. The sliding button 56 includes a pressing portion 561, a first sliding portion 563, a fastening portion 565 and a contacting portion 567. The pressing portion 561 is disposed through the hole 523 on the supporting base 52 in a movable manner. In this embodiment, the pressing portion 561 can be a U-shaped structure for the user to press the sliding button 56 conveniently. When the sliding button 56 is installed on the supporting base 52, the first sliding portion 563 is located in a position corresponding to the slot 521 on the supporting base 52, and the fastening portion 565 is connected to the first sliding portion 563 and located in a position corresponding to the slot 521 on the supporting base 52. The contacting portion 567 is connected to the pressing portion 561. In this embodiment, the contacting portion 567 can be a wedge-shaped structure. In other words, an inclined plane 5671 can be formed on a side of the contacting portion 567 for guiding the contacting portion 567 to slide relative to the stopping component 58.

Figure 10:
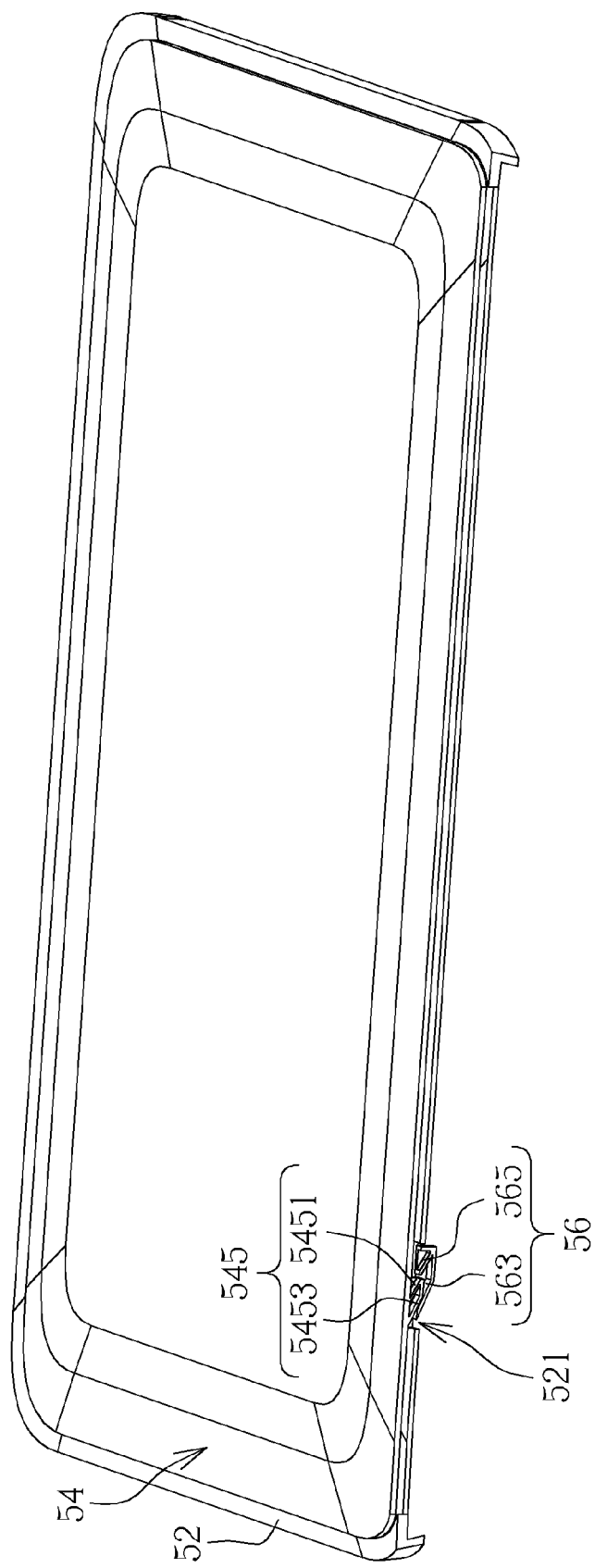
FIG. 10 is an assembly diagram illustrating the ornamental plate is installed on the supporting base according to the embodiment of the disclosure.
Figure 11:
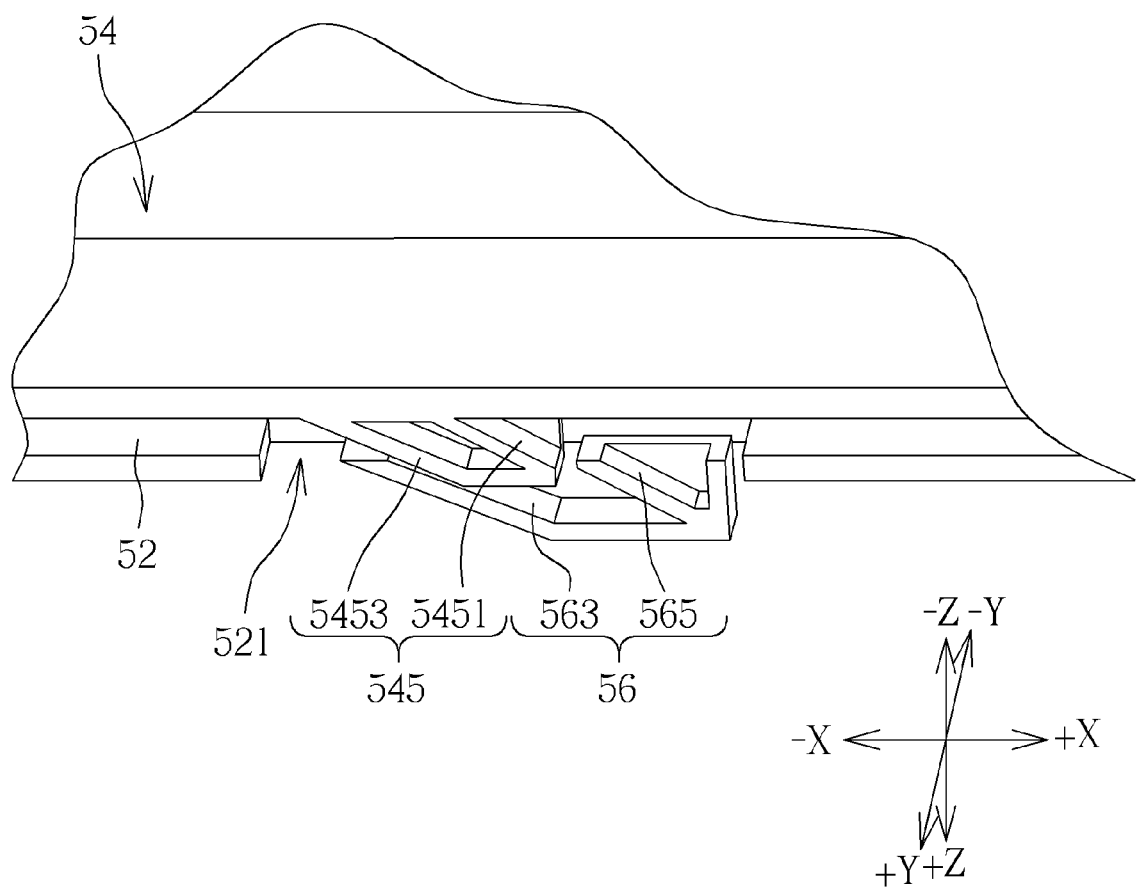
FIG. 11 and FIG. 12 are respectively a partly enlarged diagram illustrating the ornamental plate is installed on the supporting base in different statuses according to the embodiment of the disclosure.
Figure 12:
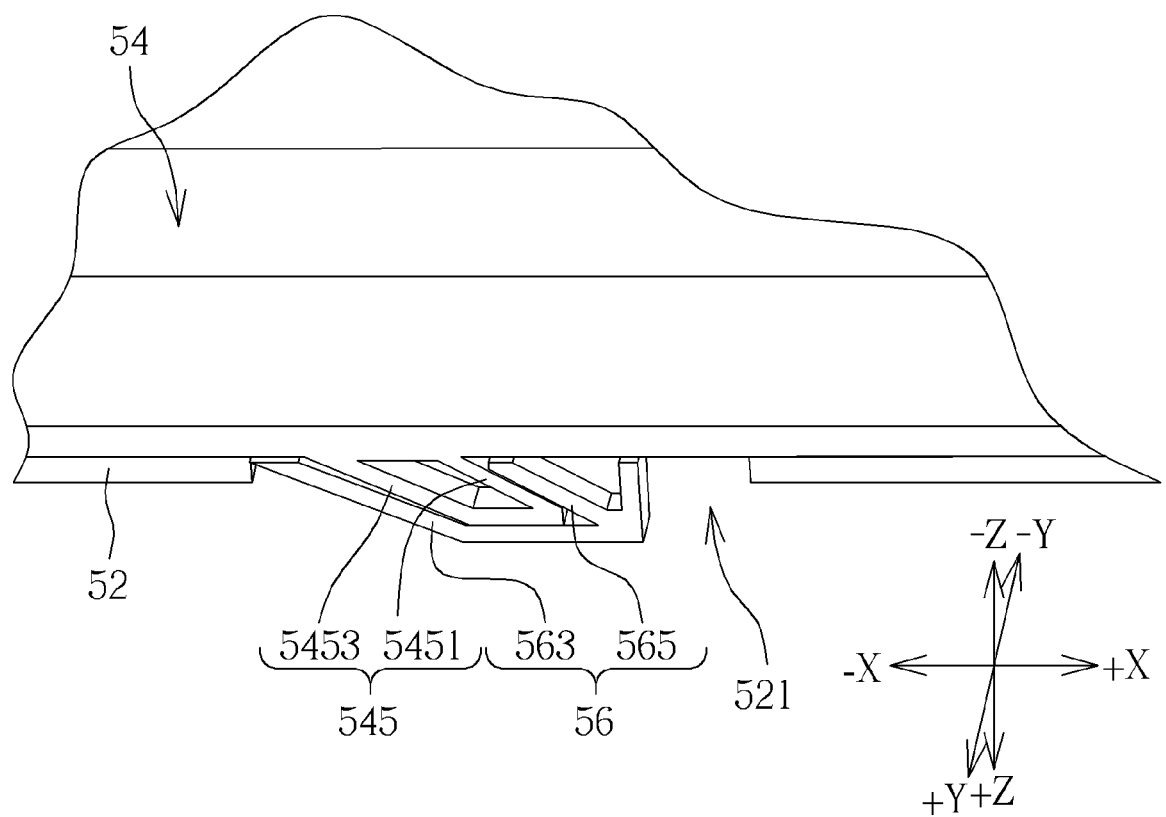

Please refer to FIG. 10 to FIG. 12. FIG. 10 is an assembly diagram illustrating the ornamental plate 54 is installed on the supporting base 52 according to the embodiment of the disclosure. FIG. 11 and FIG. 12 are respectively a partly enlarged diagram illustrating the ornamental plate 54 is installed on the supporting base 52 in different statuses according to the embodiment of the disclosure. When the ornamental plate 54 is desired to be installed on the supporting base 52, the hooking component 543 of the ornamental plate 54 is hooked with the supporting base 52 and then the ornamental plate 54 is rotated. In the meanwhile, the fixing component 545 of the ornamental plate 54, the first sliding portion 563 and the fastening portion 565 of the sliding button 56 are all located inside the slot 521 on the supporting base 52. In addition, the second sliding portion 5453 of the fixing component 545 of the ornamental plate 54 is capable of sliding relative to the first sliding portion 563 of the sliding button 56, such that the wedging portion 5451 of the fixing component 545 of the ornamental plate 54 wedges the fastening portion 565 of the sliding button 56, as shown in FIG. 10 and FIG. 11. As shown in FIG. 12, when the wedging portion 5451 of the ornamental plate 54 is completely wedged inside the fastening portion 565 of the sliding button 56, the wedging portion 5451 and the hooking component 543 can cooperatively fix the ornamental plate 54 on the supporting base 52.

Figure 13:
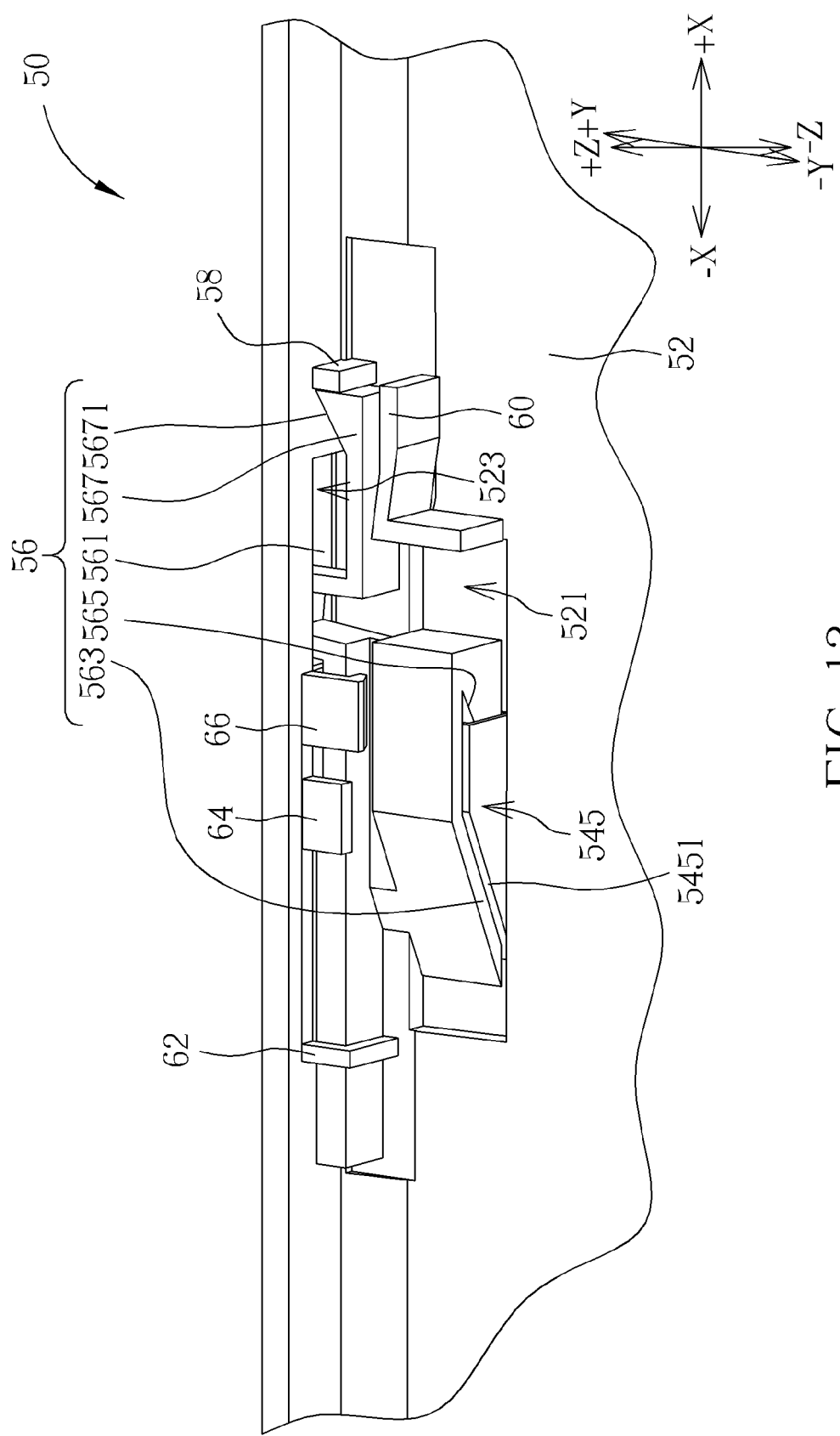
FIG. 13 to FIG. 15 are respectively diagrams of the sliding button and the ornamental plate located in different relative positions according to the embodiment of the disclosure.
Figure 14:
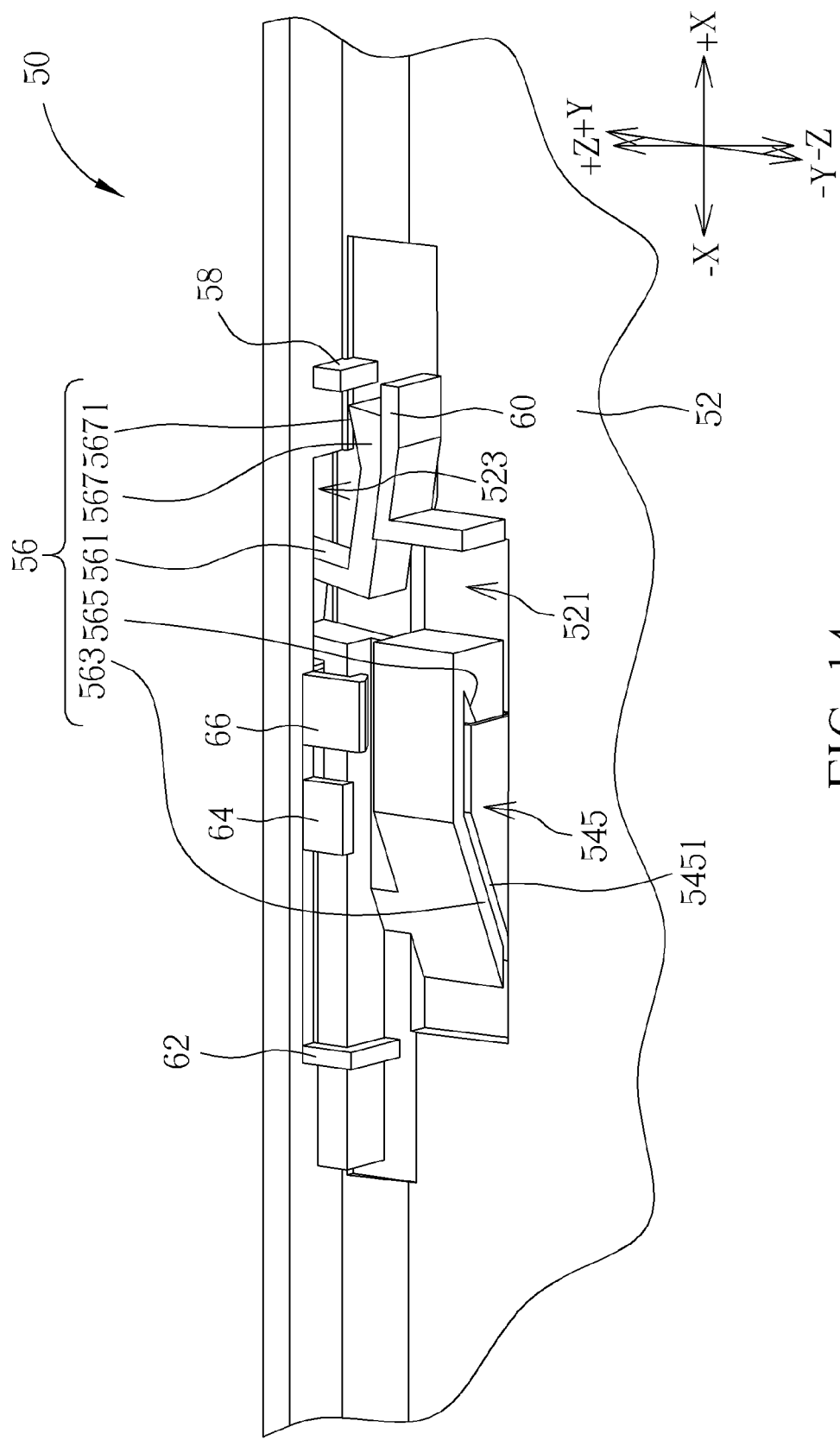
Figure 15:
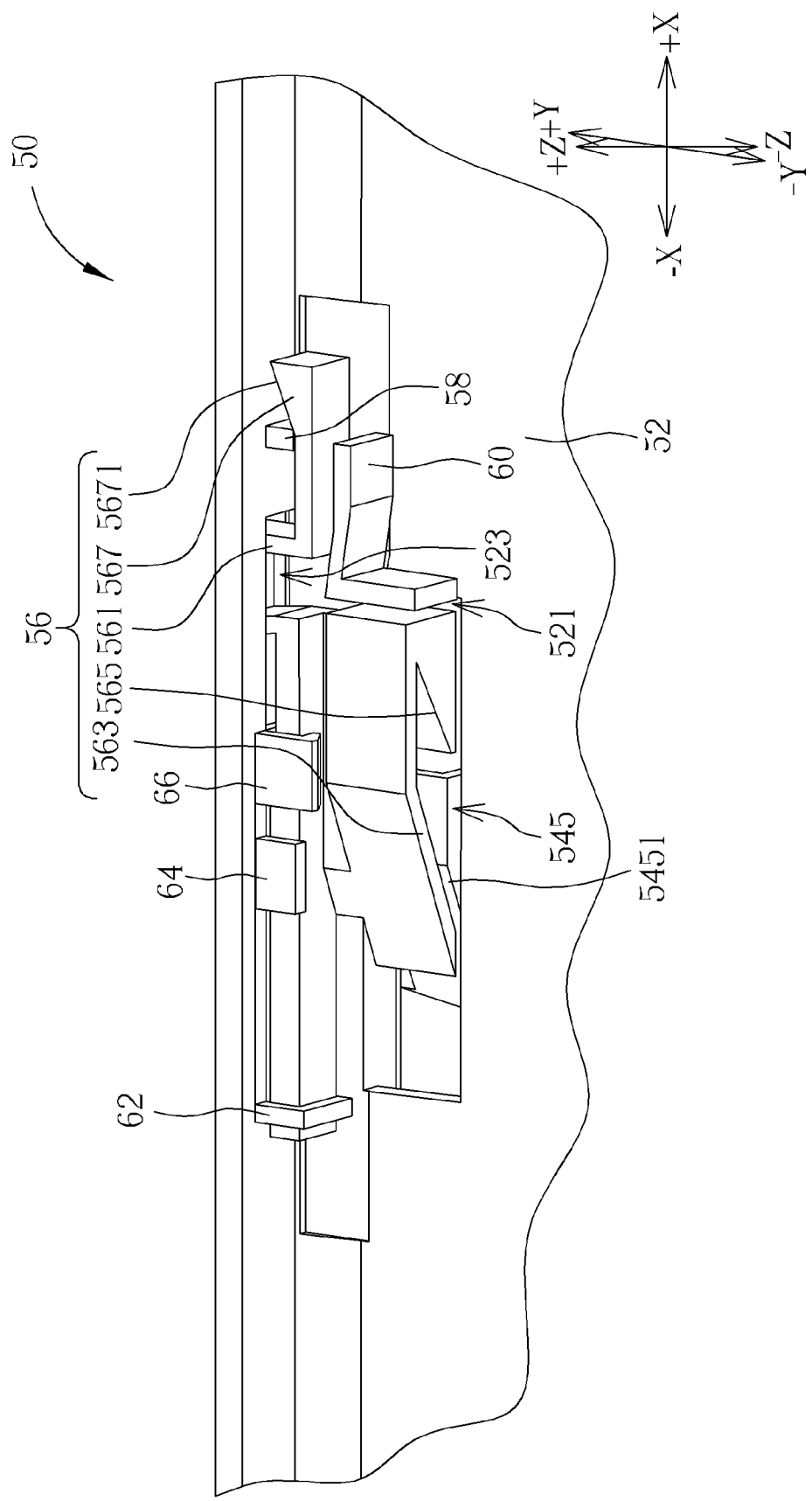

Please refer to FIG. 13 to FIG. 15. FIG. 13 to FIG. 15 are respectively diagrams of the sliding button 56 and the ornamental plate 54 located in different relative positions according to the embodiment of the disclosure. As shown in FIG. 13, when the ornamental plate 54 is fixed on the supporting base 52, the stopping component 58 stops the contacting portion 567 of the sliding button 56 in a +X direction, i.e. in a first direction. In other words, when the pressing portion 561 of the sliding button 56 is desired to slide in the +X direction and drives the contacting portion 567 simultaneously, the stopping component 58 will stop the contacting portion 567, so as to stop the pressing portion 561 from sliding. Accordingly, it can avoid the fastening portion 565 of the sliding button 56 from separating from the wedging portion 5451 of the fixing component 545 of the ornamental plate 54. Furthermore, the stopping plate 64 and the hook component 66 are respectively pressed to stop and hook the sliding button 56, so as to prevent the sliding button 56 from being deformed in a +Z direction as the sliding button 56 is forced as well as to constrain displacement of the sliding button 56 in a −Y direction, i.e. in a second direction. Accordingly, it can fix the engagement of the wedging portion 5451 of the ornamental plate 54 and the fastening portion 565 of the sliding button 56.

When the ornamental plate 54 is desired to be detached from the supporting base 52, first of all, the pressing portion 561 of the sliding button 56 is pressed in the −Y direction to deform the pressing portion 561 resiliently and to separate the contacting portion 567 connected to the pressing portion 561 from the stopping component 58. In the meanwhile, the incline 525 on the side of the hole 523 on the supporting base 52 can guide a stroke of the pressing portion 561 in the −Y direction, i.e. in the second direction. In the meanwhile, the constraining component 60 is used for constraining bending deformation of the contacting portion 567 when the pressing portion 561 is pressed in the −Y direction, i.e. in the second direction, and drives the contacting portion 567 simultaneously. Accordingly, the constraining component 60 can prevent the contacting portion 567 from being broken due to over-deformation. Afterwards, the pressing portion 561 of the sliding button 56 is desired to slide in the +X direction, i.e. in the first direction. In the meanwhile, the inclined plane 5671 can guide the contacting portion 567 to slide relative to the stopping component 58 for reducing structural interference therebetween. Furthermore, since the restraining component 62 is disposed through an end of the sliding button 56 for constraining movement of the sliding button 56 in the +X direction, i.e. in the first direction, it can smoothen entire sliding movement of the sliding button 56. Finally, as shown in FIG. 15, the fastening portion 565 of the sliding button 56 separates from the fixing component 545 of the ornamental plate 54, so as to release constraint between the sliding button 56 and the ornamental plate 54. Accordingly, the ornamental plate 54 is desired to be detached from the supporting base 52. As a result, the ornamental plate 54 can be replaced by sliding the sliding button 56.

On the other hand, when the ornamental plate 54 is desired to be installed on the supporting base 52, the hooking component 543 of the ornamental plate 54 is hooked with the supporting base 52 first and then the ornamental plate 54 is rotated. In other words, the ornamental plate 54 is pressed in a +Z direction, i.e. in a third direction, such that the fixing component 545 of the ornamental plate 54 presses the first sliding portion 563 of the sliding button 56 in the +Z direction, i.e. in the third direction. Accordingly, the second sliding portion 5453 slides relative to the first sliding portion 563, such that the sliding button 56 slides in a direction, i.e. the −X direction, opposite to the first direction and the wedging portion 5451 of the ornamental plate 54 wedges the fastening portion 565 of the sliding button 56 again. Since the principle thereof is the same as that mentioned above, further description is omitted herein for simplicity.

Figure 16:
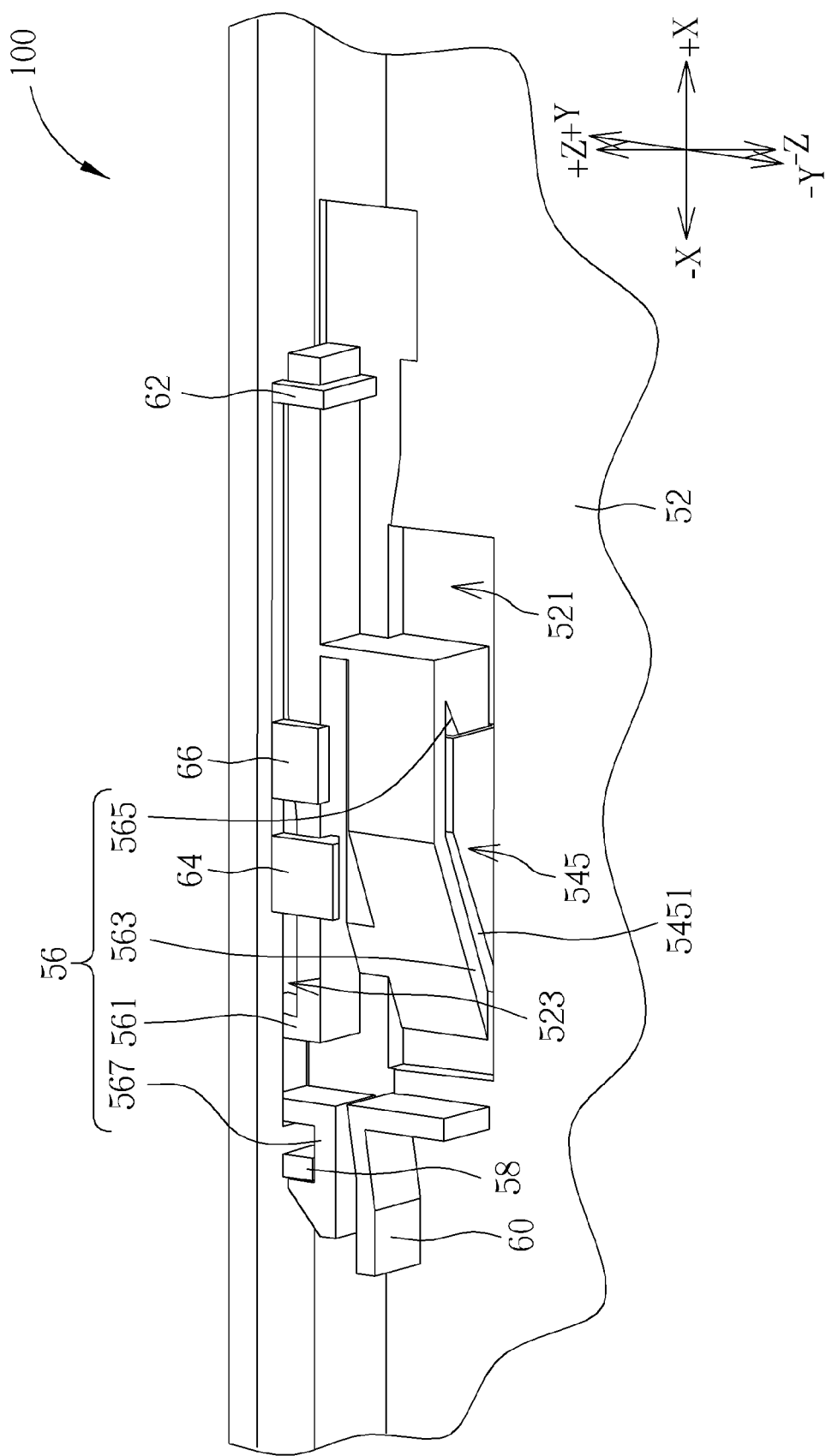
FIG. 16 is a diagram of an ornamental plate structure according to another embodiment of the disclosure.

In addition, please refer to FIG. 16. FIG. 16 is a diagram of an ornamental plate structure 100 according to another embodiment of the disclosure. The principle of the ornamental plate structure 100 is the same as that of the ornamental plate structure 50. In this embodiment, the main difference between the ornamental plate structure 100 and the aforesaid ornamental plate structure 50 is the way to fix the sliding button 56. In this embodiment, the contacting portion 567 is a hook. Furthermore, the contacting portion 567 hooks the stopping component 58, so as to constrain the stopping component 58 and the contacting portion 567 in the +X direction, such that the pressing portion 561 of the sliding button 56 is stopped from moving. Since other components with the same denotes as those in the aforesaid embodiment have same structures and functions, further description is omitted herein for simplicity. It should be noticed that the mechanism to constrain the stopping component and the contacting portion of the disclosure can not be limited to that mentioned in the aforesaid embodiments. For example, it can also adopt a recess structure and a protruding structure to achieve constraint of movement of the sliding button. As for which one of the designs is adopted, it depends on practical demands.

In contrast to the prior art, the ornamental plate structure of the disclosure utilizes the sliding button for replacing the ornamental plate and is adapted to a situation that the ornamental plate is surrounded by the supporting base. Furthermore, the ornamental plate structure has advantages of simple structure and fewer components, and there is no need to preserve large mechanical space for the ornamental plate structure. Accordingly, the disclosure provides the ornamental plate structure with easy assembly and less cost.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An ornamental plate structure, comprising:
    a supporting base whereon a slot and a hole are formed;
    a sliding button installed on a side of the supporting base and comprising:
        a pressing portion disposed through the hole on the supporting base in a movable manner;
        a first sliding portion located in a position corresponding to the slot on the supporting base;
        a fastening portion connected to the first sliding portion and located in a position corresponding to the slot on the supporting base; and
        a contacting portion connected to the pressing portion;
    a stopping component installed on the supporting base for stopping the contacting portion as the pressing portion moves in a first direction to drive the contacting portion; and
    an ornamental plate installed on the supporting base in a detachable manner, comprising:
        a plate;
        a hooking component disposed on a side of the plate for hooking the supporting base; and
        a fixing component installed on the plate and comprising a wedging portion and a second sliding portion, the wedging portion wedging inside the fastening portion as the second sliding portion slides relative to the first sliding portion of the sliding button, so as to fix the ornamental plate on the supporting base.

2. The ornamental plate structure of claim 1, further comprising:
    a constraining component installed on the supporting base for constraining bending deformation of the contacting portion as the pressing portion is pressed in a second direction to drive the contacting portion.

3. The ornamental plate structure of claim 2, wherein when the fixing component of the ornamental plate presses the first sliding portion in a third direction, the second sliding portion slides relative to the first sliding portion, such that the sliding button slides in a direction opposite to the first direction and the wedging portion wedges the fastening portion.

4. The ornamental plate structure of claim 2, wherein the fastening portion separates from the wedging portion as the pressing portion is pressed in the second direction and moved in the first direction.

5. The ornamental plate structure of claim 3, wherein the fastening portion separates from the wedging portion as the pressing portion is pressed in the second direction and moved in the first direction.

6. The ornamental plate structure of claim 2, further comprising a restraining component installed on the supporting base and disposed through an end of the sliding button for restraining the sliding button from sliding in the first direction.

7. The ornamental plate structure of claim 6, wherein an inclined plane is formed on a side of the contacting portion for guiding the contacting portion to slide relative to the stopping component.

8. The ornamental plate structure of claim 7, wherein the contacting portion is a wedge-shaped structure or a hook.

9. The ornamental plate structure of claim 8, further comprising a stopping plate and a hook component installed on the supporting base for stopping the sliding button.

10. The ornamental plate structure of claim 7, wherein the restraining component is an L-shaped rib.

11. The ornamental plate structure of claim 7, wherein the pressing portion of the sliding button is a U-shaped structure.

12. The ornamental plate structure of claim 6, wherein the restraining component is an L-shaped rib.

13. The ornamental plate structure of claim 2, wherein an inclined plane is formed on a side of the contacting portion for guiding the contacting portion to slide relative to the stopping component.

14. The ornamental plate structure of claim 13, wherein the contacting portion is a wedge-shaped structure or a hook.

15. The ornamental plate structure of claim 2, wherein the contacting portion is a wedge-shaped structure or a hook.

16. The ornamental plate structure of claim 1, wherein an inclined plane is formed on a side of the contacting portion for guiding the contacting portion to slide relative to the stopping component.

17. The ornamental plate structure of claim 16, wherein the contacting portion is a wedge-shaped structure or a hook.

18. The ornamental plate structure of claim 1, further comprising a stopping plate and a hook component installed on the supporting base for stopping the sliding button.

19. The ornamental plate structure of claim 1, wherein the pressing portion of the sliding button is a U-shaped structure.

20. The ornamental plate structure of claim 1, wherein an incline is formed on at least one side of the hole on the supporting base for guiding the pressing portion to be pressed in the second direction.

* * * * *

UNITED STATES PATENT AND TRADEMARK OFFICE
CERTIFICATE OF CORRECTION

| | | |
|---|---|---|
| PATENT NO. | : 8,920,903 B2 | Page 1 of 1 |
| APPLICATION NO. | : 13/558327 | |
| DATED | : December 30, 2014 | |
| INVENTOR(S) | : Chen-Yi Liang | |

It is certified that error appears in the above-identified patent and that said Letters Patent is hereby corrected as shown below:

On the title page, item (54) and in the specification, column 1, line 1, correct the title of invention from "PLATE STRUCTURE WITH EASY ASSEMBLY" to --ORNAMENTAL PLATE STRUCTURE WITH EASY ASSEMBLY--.

Signed and Sealed this
Twelfth Day of May, 2015

Michelle K. Lee
*Director of the United States Patent and Trademark Office*